(12) United States Patent
Yoon et al.

(10) Patent No.: US 8,022,411 B2
(45) Date of Patent: Sep. 20, 2011

(54) THIN-FILM TRANSISTOR DISPLAY PANEL AND METHOD OF FABRICATING THE SAME

(75) Inventors: Kap-Soo Yoon, Seoul (KR); Ki-Won Kim, Suwon-si (KR); Sung-Ryul Kim, Cheonan-si (KR); Sung-Hoon Yang, Seoul (KR); Woo-Geun Lee, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 149 days.

(21) Appl. No.: 12/499,009

(22) Filed: Jul. 7, 2009

(65) Prior Publication Data

US 2010/0059745 A1  Mar. 11, 2010

(30) Foreign Application Priority Data

Sep. 9, 2008 (KR) .................. 10-2008-0088842

(51) Int. Cl.
  *H01L 51/52* (2006.01)
(52) U.S. Cl. .................. 257/72; 257/E33.053
(58) Field of Classification Search .......... 257/59, 257/69–73, E33.053; 438/151
  See application file for complete search history.

(56) References Cited

U.S. PATENT DOCUMENTS

| | | | | |
|---|---|---|---|---|
| 7,492,090 B2* | 2/2009 | Yamazaki et al. | ........... | 313/503 |
| 7,586,131 B2* | 9/2009 | Nishiki et al. | ............... | 257/202 |
| 7,737,449 B2* | 6/2010 | Yamazaki et al. | ............ | 257/72 |
| 7,786,494 B2* | 8/2010 | Lee et al. | ........ | 257/88 |
| 2007/0152219 A1* | 7/2007 | Lim | ........ | 257/59 |
| 2007/0262315 A1* | 11/2007 | Lee et al. | ........ | 257/72 |
| 2008/0277658 A1* | 11/2008 | Lee et al. | ........ | 257/43 |
| 2009/0141207 A1* | 6/2009 | Um et al. | ........ | 349/46 |
| 2009/0180045 A1* | 7/2009 | Yoon et al. | ........ | 349/43 |
| 2009/0278127 A1* | 11/2009 | Kim et al. | ........ | 257/59 |
| 2010/0001284 A1* | 1/2010 | Cho et al. | ........ | 257/72 |

FOREIGN PATENT DOCUMENTS

| | | |
|---|---|---|
| JP | 06-061222 | 3/1994 |
| JP | 2005-079254 A | 3/2005 |
| KR | 1020010113557 A | 12/2001 |

* cited by examiner

*Primary Examiner* — Nathan Ha
(74) *Attorney, Agent, or Firm* — Innovation Counsel LLP

(57) ABSTRACT

Provided are a thin-film transistor (TFT) display panel having improved electrical properties that can be fabricated time-effectively and a method of fabricating the TFT display panel. The TFT display panel includes: gate wirings which are formed on an insulating substrate; oxide active layer patterns which are formed on the gate wirings; data wirings which are formed on the oxide active layer patterns to cross the gate wirings; a passivation layer which is formed on the oxide active layer patterns and the data wirings and is made of silicon nitride (SiNx); and a pixel electrode which is formed on the passivation layer.

21 Claims, 13 Drawing Sheets

THIN-FILM TRANSISTOR DISPLAY PANEL AND METHOD OF FABRICATING THE SAME

This application claims priority from Korean Patent Application No. 10-2008-0088842 filed on Sep. 9, 2008 in the Korean Intellectual Property Office, the disclosure of which is incorporated herein by reference in its entirety.

BACKGROUND OF THE INVENTION

1. Field of the Invention

The present invention relates to a thin-film transistor (TFT) display panel and a method of fabricating the same, and more particularly to a TFT display panel having improved electrical properties that can be fabricated in a reduced time and a method of fabricating the TFT display panel.

2. Description of the Related Art

Liquid crystal displays (LCDs) are one of the most widely used flat panel displays (FPDs). An LCD includes two substrates having electrodes formed thereon and a liquid crystal layer interposed between the two substrates. The LCD applies voltages to the electrodes to rearrange liquid crystal molecules of the liquid crystal layer and thus control the amount of light that passes through the liquid crystal layer.

With the soaring demand for LCDs, and in particular higher-quality LCDs, a lot of research is being conducted to develop LCDs with improved current and light tolerance. Oxide TFT display panels using oxide semiconductors as active layer patterns have high mobility, light insensitivity, and low-temperature deposition properties. Due to these properties, oxide TFT display panels are increasingly used in LCDs.

An oxide TFT display panel includes oxide active layer patterns made of an oxide semiconductor, a passivation layer disposed on the oxide active layer patterns, and a gate insulating film disposed under the oxide active layer patterns.

If the passivation layer or the gate insulating film contains hydrogen atoms, the hydrogen atoms may move to the oxide active layer patterns so as to react with the oxide active layer patterns. Accordingly, the oxide active layer patterns may become conductive, rendering the oxide TFT display panel unable to perform its function.

To prevent this problem, a method of forming a passivation layer as an oxide layer or a double layer including an oxide and a nitride is being researched. A problem with forming a passivation layer as an oxide layer is that oxide layer is difficult to etch. In addition, since oxides have a low deposition rate, forming the passivation layer takes longer when the passivation layer is made of an oxide. Furthermore, the uniformity of drain-source current for a gate voltage can be compromised. When the passivation layer is formed as a double layer including an oxide and a nitride, the time required to form the passivation layer and the difficulty of forming the passivation layer may be increased.

SUMMARY OF THE INVENTION

Aspects of the present invention provide a thin-film transistor (TFT) display panel having improved electrical properties that can be fabricated in less time than the conventional counterparts.

Aspects of the present invention also provide a method of fabricating a TFT display panel having improved electrical properties that can be fabricated in less time.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a TFT display panel including: gate wirings formed on an insulating substrate; oxide active layer patterns formed on the gate wirings; data wirings formed on the oxide active layer patterns to cross the gate wirings; a passivation layer formed on the oxide active layer patterns and the data wirings and is made of silicon nitride (SiNx); and a pixel electrode which is formed on the passivation layer.

According to another aspect of the present invention, there is provided a TFT display panel including: gate wirings formed on an insulating substrate; a gate insulating film which includes a lower gate insulating film formed on the gate wirings and made of first SiNx and an upper gate insulating film formed on the lower gate insulating film and made of second SiNx; oxide active layer patterns formed on the gate insulating film; data wirings formed on the oxide active layer patterns to cross the gate wirings; a passivation layer formed on the oxide active layer patterns and the data wirings; and a pixel electrode formed on the passivation layer, wherein the second SiNx contains a smaller amount of hydrogen than the first SiNx.

According to another aspect of the present invention, there is provided a method of fabricating a TFT display panel. The method includes: forming gate wirings on an insulating substrate; forming oxide active layer patterns on the gate wirings; forming data wirings on the oxide active layer patterns to cross the gate wirings; forming a passivation layer of SiNx on the oxide active layer patterns and the data wirings; and forming a pixel electrode on the passivation layer.

According to another aspect of the present invention, there is provided a method of fabricating a TFT display panel. The method includes: forming gate wirings on an insulating substrate; forming a lower gate insulating film, which is made of first SiNx, on the gate wirings and forming an upper gate insulating film, which is made of second SiNx, on the lower gate insulating film; forming oxide active layer patterns on the gate insulating film; forming data wirings on the oxide active layer patterns to cross the gate wirings; forming a passivation layer on the oxide active layer patterns and the data wirings; and forming a pixel electrode on the passivation layer, wherein the second SiNx contains a smaller amount of hydrogen than the first SiNx.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1A:
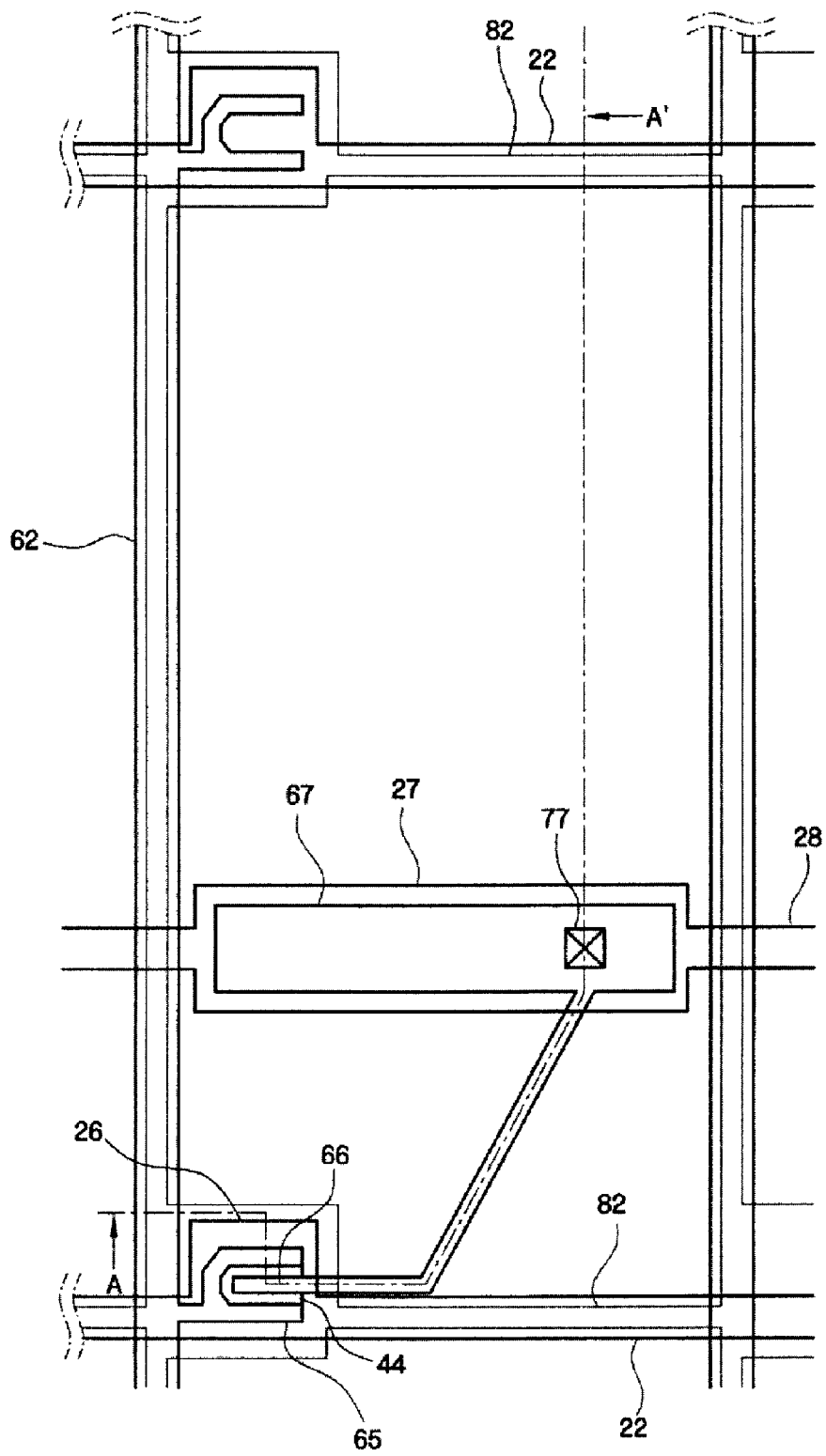
FIG. 1A is a plan view of a thin-film transistor (TFT) display panel according to a first exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, well-known processes, well-known structures and well-known technologies will not be specifically described in order to avoid ambiguous interpretation of the present invention. Like reference numerals refer to like elements throughout the specification.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or components would then be oriented "above" the other elements or components. Thus, the exemplary term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
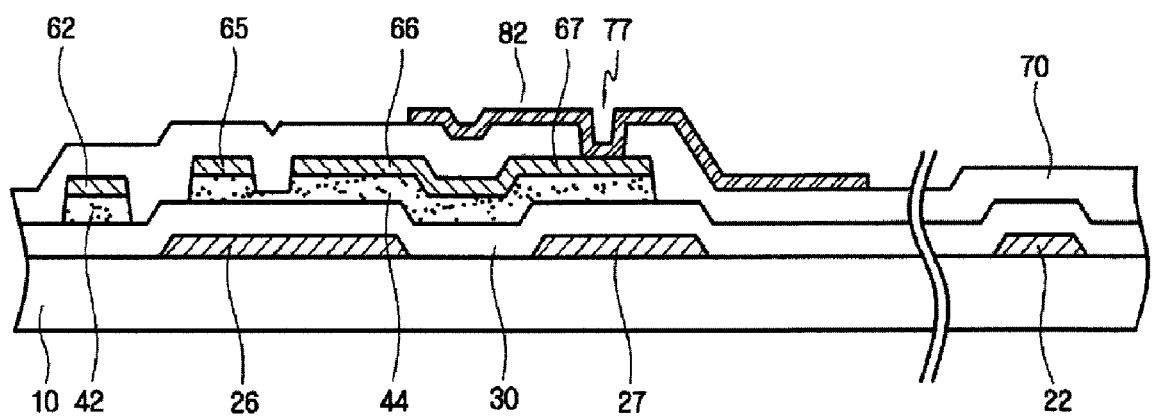
FIG. 1B is a cross-sectional view of the TFT display panel according to the first exemplary embodiment, taken along the line A-A' of FIG. 1A.

Hereinafter, a thin-film transistor (TFT) display panel according to a first exemplary embodiment of the present invention will be described in detail with reference to FIGS. 1A ad 1B. FIG. 1A is a plan view of the TFT display panel according to the first exemplary embodiment of the present invention. FIG. 1B is a cross-sectional view of the TFT display panel according to the first exemplary embodiment, taken along the line A-A' of FIG. 1A.

Referring to FIGS. 1A and 1B, the TFT display panel includes various devices, such as TFTs, which are formed on an insulating substrate 10. The insulating substrate 10 is made of glass, such as soda lime glass or boro-silicate glass, or plastic.

Gate wirings, which deliver gate signals, are also formed on the insulating substrate 10. Each gate wiring includes a gate line 22 which extends in a first direction, for example a horizontal direction, and a gate electrode 26 which extends from the gate line 22 to form a part of the TFT.

In addition, storage wiring is formed on the insulating substrate 10. The storage wiring delivers a common voltage and includes a storage electrode 27 and a storage line 28. The storage line 28 may extend in the horizontal direction to be substantially parallel to the gate line 22. The storage electrode 27 may be wider than the storage line 28. The storage electrode 27 overlaps a drain electrode extension portion 67 connected to a pixel electrode 82, which will be described later, to form a storage capacitor that improves the charge storage capability of a pixel.

The storage wiring may have various shapes and may be disposed at various locations. In addition, if sufficient storage capacitance is generated by the overlapping of the pixel electrode 82 and the gate line 22, the storage wiring may not be formed.

Each of the gate wiring (i.e., the gate line 22 and the gate electrode 26) and the storage wiring (i.e., the storage electrode 27 and the storage line 28) may be made of Al-based metal such as Al or Al alloy, Ag-based metal such as Ag or Ag alloy, Cu-based metal such as Cu or Cu alloy, Mo-based metal such as Mo or Mo alloy, Cr, Ti, or Ta.

In addition, each of the gate wiring and the storage wiring may have a multilayer structure composed of two conductive layers (not shown) with different physical characteristics. In this case, one of the two conductive layers may be made of a metal with low resistivity, such as Al-based metal, Ag-based metal or Cu-based metal, in order to reduce a signal delay or a voltage drop of each of the gate wiring and the storage wiring. On the other hand, the other one of the conductive layers may be made of a different material, in particular, a material having superior contact characteristics with zinc oxide (ZnO), indium tin oxide (ITO) and indium zinc oxide (IZO), such as Mo-based metal, Cr, Ti, or Ta. Examples of the multilayer structure include a combination of a Cr lower layer and an Al upper layer and a combination of an Al lower layer and a Mo upper layer. However, the present invention is not limited thereto. Each of the gate wiring and the storage wiring may be made of any other suitable metals and conductors.

A gate insulating film 30, which is made of silicon oxide (SiOx) or silicon nitride (SiNx), is formed on the gate wirings and the storage wirings.

Oxide active layer patterns 42 and 44 are formed on the gate insulating film 30. Each of the oxide active layer patterns 42 and 44 is made of an oxide of a material selected from Zn, In, Ga, Sn, and a combination of the same. The term "active" denotes that each of the oxide active layer patterns 42 and 44 is made of an active material which has electrical properties when driving current is applied to the active material. The active material includes a semiconductor and a metal oxide. For example, each of the oxide active layer patterns 42 and 44 may be made of a material selected from ZnO, InZnO, InGaO, InSnO, ZnSnO, GaSnO, GaZnO, GaZnSnO, and GaInZnO. Each of the oxide active layer patterns 42 and 44 has 10 to 100 times greater effective charge mobility than hydrogenated amorphous silicon and has an ON/OFF current rate of $10^5$ to $10^8$. Thus, the oxide active layer patterns 42 and 44 show excellent semiconductor properties.

In addition, each of the oxide active layer patterns 42 and 44 has a band gap of approximately 3.0 to 3.5 eV Therefore, even when each of the oxide active layer patterns 42 and 44 is exposed to visible light, it does not experience the leakage of photocurrent. Consequently, an instantaneous afterimage can be prevented from being formed by an oxide TFT. In addition, since there is no need to form a light-blocking film under the oxide TFT, an aperture ratio of the TFT display panel can be increased.

In order to enhance the properties of an oxide TFT, each of the oxide active layer patterns 42 and 44 may additionally include an element, which belongs to group 3, 4 or 5 of a periodic table, or a transition element. While each of the oxide active layer patterns 42 and 44 is amorphous, it has high effective charge mobility and can be formed by using a conventional method of fabricating amorphous silicon. Therefore, the oxide active layer patterns 42 and 44 can be applied to display devices having large areas.

Data wirings are formed on the oxide active layer pattern 42 and 44 and the gate insulating film 30. Each of the data wiring includes a data line 62, a source electrode 65, a drain electrode 66, and a drain electrode extension portion 67. The data line 62 extends in a second direction that is substantially perpendicular to the first direction, and crosses the gate line 22 to define a pixel. The source electrode 65 branches off from the data line 62 and extends onto the oxide active layer patterns 42 and 44. The drain electrode 66 is separated from the source electrode 65 and formed on the oxide active layer patterns 42 and 44 to face the source electrode 65 with respect to the gate electrode 26 or a channel region of the oxide TFT. The drain electrode extension portion 67 having a large area extends from the drain electrode 66 and overlaps the storage electrode 27.

As shown in FIG. 1B, the data wirings (i.e., the data line 62, the source electrode 65, the drain electrode 66, and the drain electrode extension portion 67) may directly contact the oxide active layer patterns 42 and 44 to form an ohmic contact. In order to form an ohmic contact, each of the data wiring may include a monolayer or a multilayer made of a material or materials selected from Ni, Co, Ti, Ag, Cu, Mo, Al, Be, Nb, Au, Fe, Se and Ta. Examples of the multilayer include a double layer, such as Ta/Al, Ta/Al, Ni/Al, Co/Al or Mo (Mo alloy)/Cu, and a triple layer such as Ti/Al/Ti, Ta/Al/Ta, Ti/Al/TiN, Ta/Al/TaN, Ni/Al/Ni or Co/Al/Co. The data wirings may also be made of materials other than the above materials. In addition, the data wiring mays not directly contact the oxide active layer patterns 42 and 44, and an ohmic contact layer (not shown) may be formed between the data wirings and the oxide active layer patterns 42 and 44 in order to form an ohmic contact between them.

The source electrode 65 overlaps at least part of each of the oxide active layer patterns 42 and 44, and the drain electrode 66 faces the source electrode 65 with respect to the channel region of the oxide TFT and overlaps at least part of each of the oxide active layer patterns 42 and 44.

A passivation layer 70 is formed on the data wirings and the oxide active layer patterns 42 and 44. In the present embodiment, the passivation layer 70 is made of SiNx. Since the passivation layer 70 according to the present embodiment directly contacts the oxide active layer patterns 42 and 44, it may contain a small number of hydrogen atoms. It is desirable to form the passivation layer 70 using SiNx that does not contain hydrogen. Hydrogen atoms contained in the passivation layer 70 may move to the oxide active layer patterns so as to react with the oxide active layer patterns 42 and 44. Then, the oxide active layer patterns 42 and 44 may become conductive, thereby causing the TFT display panel to lose its properties.

Since the TFT display panel according to the present embodiment uses the passivation layer 70 made of SiNx and does not contain hydrogen, the electrical properties of the oxide active layer patterns 42 and 44 can be enhanced. The passivation layer 70 may have a thickness of 1,500 to 2,500 Å. When the passivation layer 70 has a thickness of 1,500 Å or less, it may not function as intended. When the passivation layer 70 has a thickness of more than 2,500 Å, it is difficult to mass-produce the passivation layer 70.

As another way to enhance the properties of the oxide active layer patterns 42 and 44, a passivation layer (not shown) having a double-layer structure made of SiOx and SiNx may also be used. A TFT display panel using a passivation layer which is a double layer will later be compared with the TFT display panel according to the present embodiment.

A contact hole 77 is formed in the passivation layer 70 and extends to the drain electrode extension portion 67. The pixel electrode 82 is formed on the passivation layer 70 and is electrically connected to the drain electrode 66 by the contact hole 77.

The pixel electrode 82 may be made of a transparent conductor, such as ITO or IZO, or a reflective conductor such as Al. The pixel electrode 82 is electrically connected to the drain electrode extension portion 67 by the contact hole 77. When a data voltage is applied to the pixel electrode 82, the pixel electrode 82 generates an electric field together with a common electrode (not shown) and re-orients the liquid crystal molecules of a liquid crystal layer (not shown). Typically, the liquid crystal layer is interposed between the TFT display panel and a common electrode display panel (not shown). The method of combining the common electrode and the liquid crystal layer with the TFT display panel is well known.

Figure 2A:
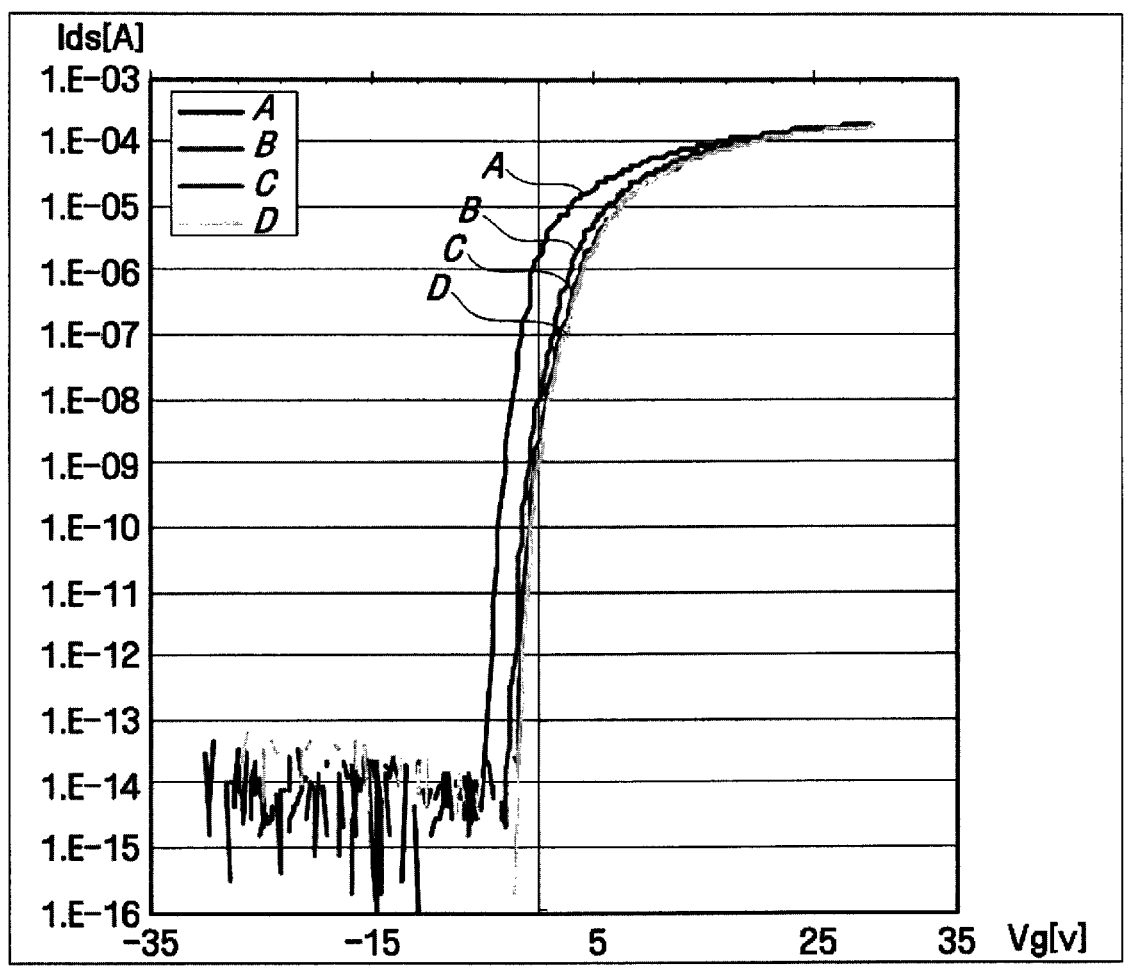
FIG. 2A is a graph illustrating the variation in voltage and current properties as a function of time, for a TFT display panel according to an embodiment of the invention.
Figure 2B:
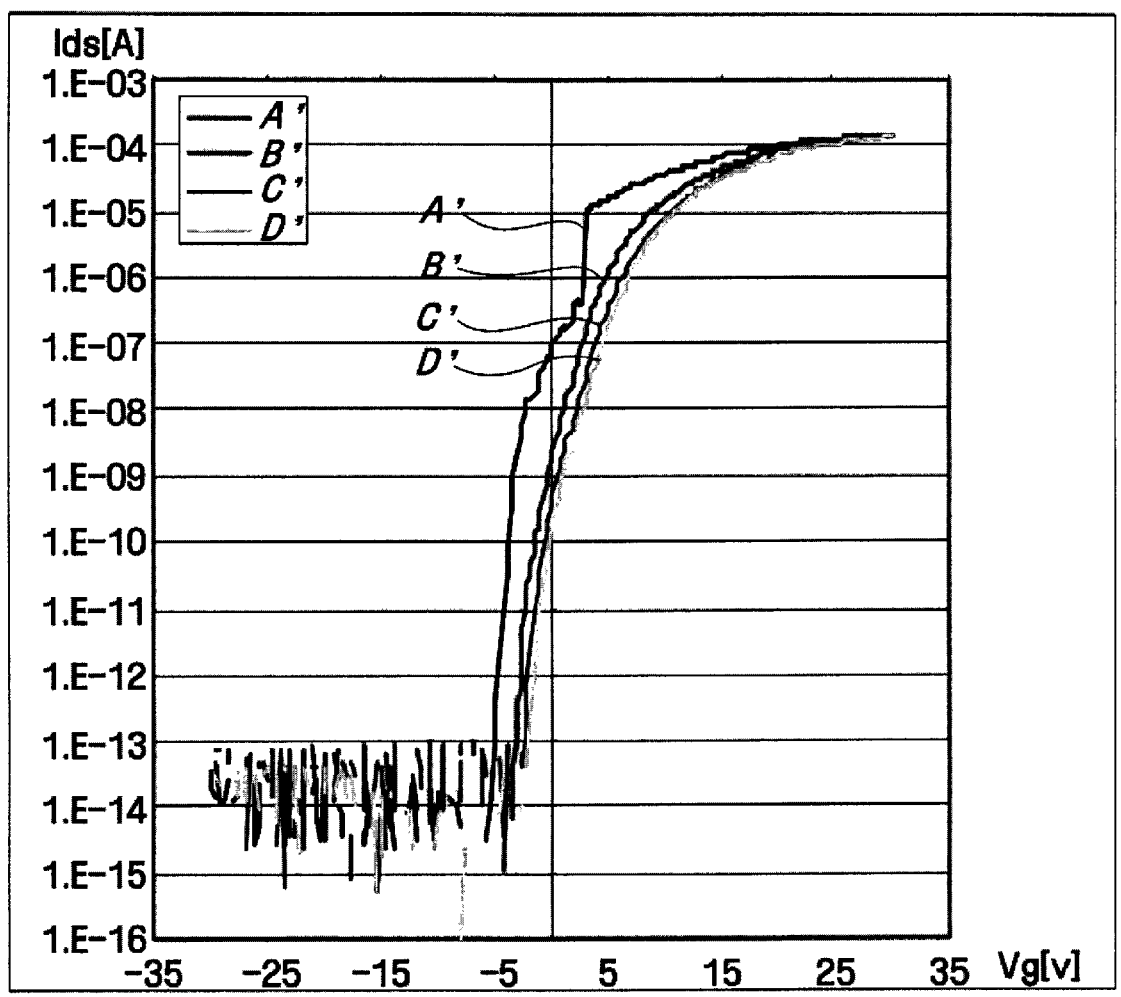
FIG. 2B is a graph illustrating the variation in the voltage and current properties as a function of time, for a conventional TFT display panel.
Figure 3A:
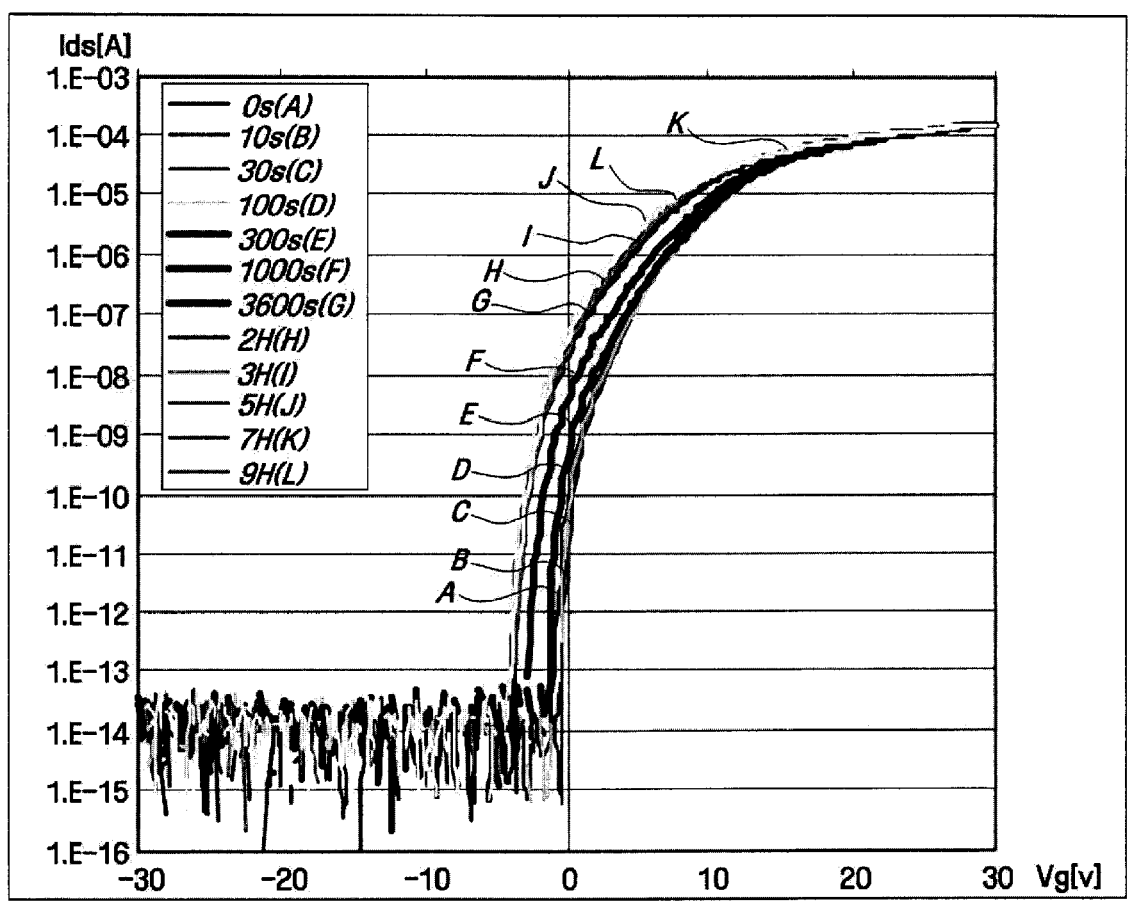
FIG. 3A is a graph illustrating the variation in the voltage and current properties in response to applied stress, for a TFT display panel according to an embodiment of the invention.
Figure 3B:
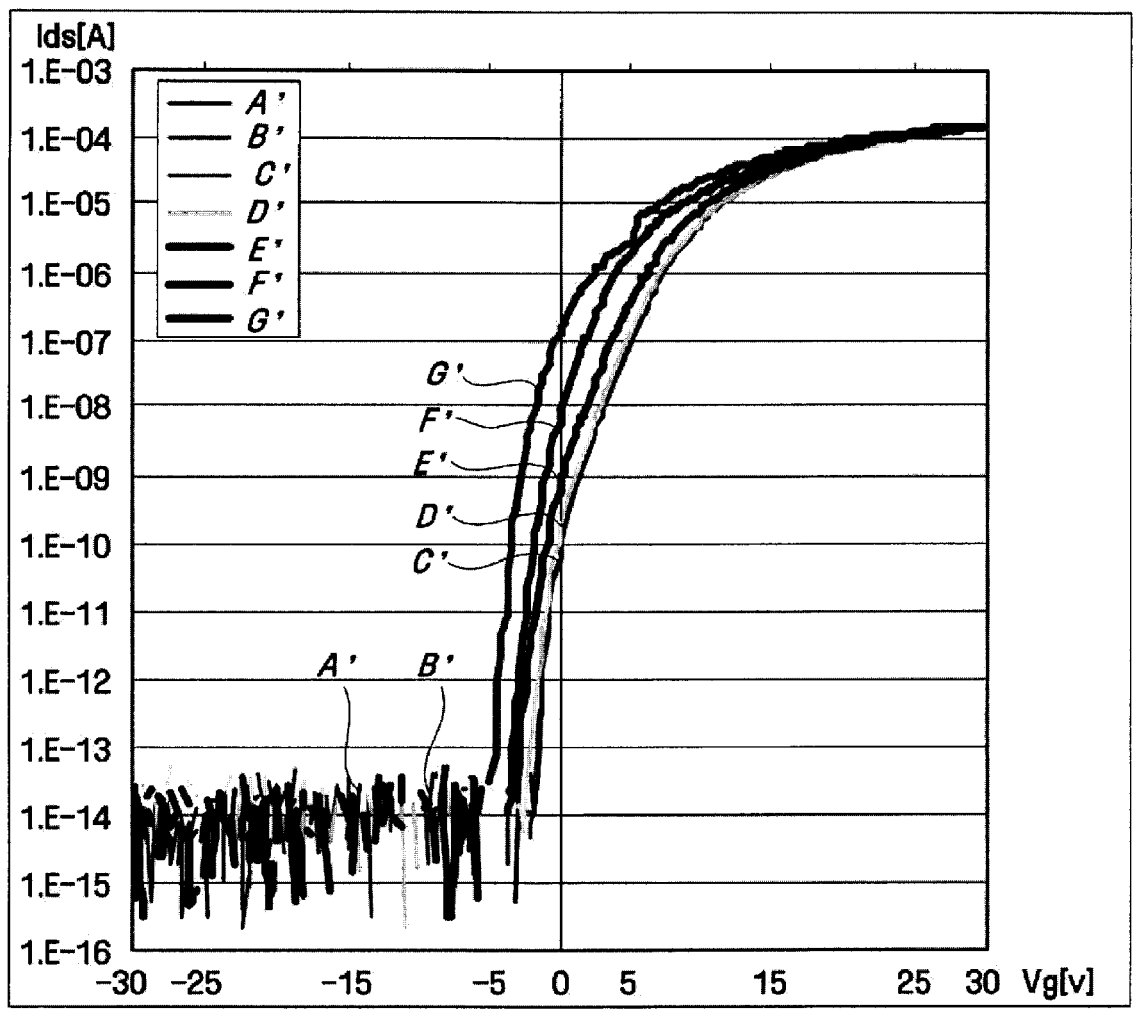
FIG. 3B is a graph illustrating the variation in the voltage and current properties in response to applied stress, for a conventional TFT display panel.
Figure 4:
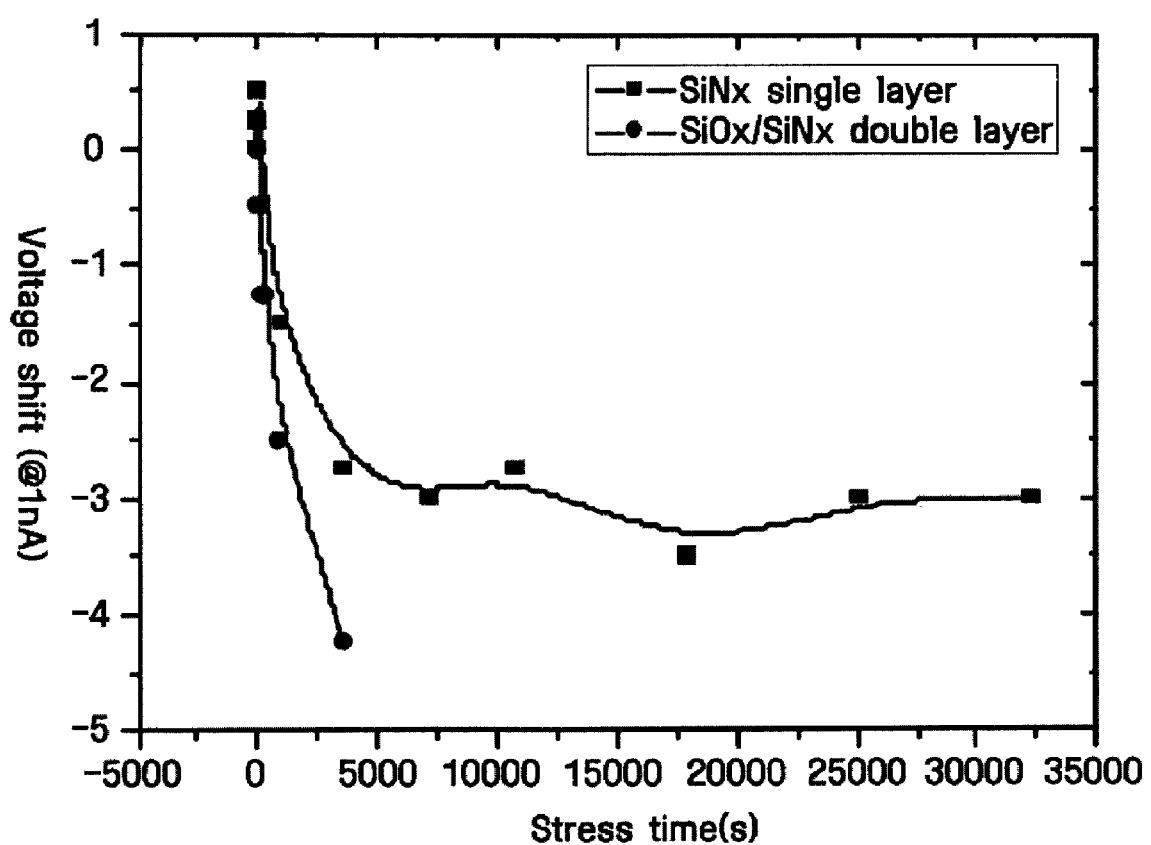
FIG. 4 is a graph illustrating the shift in a threshold voltage of a TFT display panel of the invention and a conventional TFT display panel.

Hereinafter, the voltage and current properties of the TFT display panel according to the first exemplary embodiment will be compared with a TFT display panel according to a comparative example with reference to FIGS. 2A through 4. FIGS. 2A and 2B are graphs illustrating the variation in the voltage and current properties as a function of time, for the TFT display of the first embodiment and a conventional TFT display panel, respectively. FIGS. 3A and 3B are graphs illustrating the variation in the voltage and current properties in response to applied stress, for the TFT display panel of the first embodiment and a conventional TFT display panel. The period during which stress is applied to the panels is herein referred to as "stress time." Stress is calculated under the condition of Vg=-20V, Vds=10V, at 60° C. FIG. 4 is a graph illustrating a shift in a threshold voltage Vth of each of the TFT display panel of the first embodiment and a conventional TFT display panel.

The "conventional TFT display panel" includes a first passivation layer that is made of SiOx and formed on oxide active layer patterns, and a second passivation layer that is made of SiNx and is formed on the first passivation layer.

The data provided in FIG. 2A was obtained by measuring drain-source current $I_{ds}$ of the TFT display panel of the first embodiment of the invention while gradually increasing a gate voltage Vg from −35 V to 35 V. The drain-source current $I_{ds}$ of the TFT display panel according to the first exemplary embodiment was measured four times (at A, B, C, and D). According to the measurement results, a TFT was turned on when the gate voltage Vg was about −5 V, and there was a minor shift in the threshold voltage Vth of the TFT display panel when the display panel of the first embodiment is used.

The data provided in FIG. 2B was obtained by measuring the drain-source current $I_{ds}$ of the conventional TFT display panel while gradually increasing the gate voltage Vg from −35 V to 35 V. The drain-source current $I_{ds}$ of the TFT display panel according to the comparative example was measured four times (at A', B', C', and D'). According to the measurement results, a TFT was turned on when the gate voltage Vg was about −5 V, and there was a minor shift in the threshold voltage Vth of the TFT display panel when the conventional display panel was used.

According to the measurement results shown in FIGS. 2A and 2B, the shift in the threshold voltage Vth according to the frequency of measurement was negligible. In addition, the voltage and current properties of the TFT display panel of the first embodiment were not worse than those of the conventional TFT display panel that had been fabricated using complex processes.

The data provided in FIG. 3A was obtained by measuring the drain-source current $I_{ds}$ of the TFT display panel of the first embodiment with respect to the gate voltage Vg while varying the period of time during which stress was applied to the TFT display panel. When stress was applied to the TFT display panel of the first embodiment for stress times of A(0s), B(10s), C(30s), D(100s), E(300s), F(1000s), G(3600s), H(2H), I(3H), J(5H), K(7H) and L(9H), there was a minor shift in the threshold voltage Vth of the TFT display panel according to the first exemplary embodiment.

The data provided in FIG. 3B was obtained by measuring the drain-source current $I_{ds}$ of a conventional TFT display panel with respect to the gate voltage Vg while varying the period of time during which stress was applied to the TFT display panel. When stress was applied to the conventional TFT display panel for stress times of A'(0s), B'(10s), C'(30s), D'(100s), E'(300s), F'(1000s) and G'(3600s), the conventional TFT display panel showed a greater shift in the threshold voltage Vth than the TFT display panel of the invention.

That is, the TFT display panel of the first embodiment, which includes the passivation layer 70 formed as an SiNx layer, showed greater stability during the stress time than the conventional TFT display panel that includes the passivation layer formed as a double layer.

FIG. 4 is a graph illustrating a shift in the threshold voltage Vth of the TFT display panel of the first embodiment and the conventional TFT display panel with respect to stress time at 1 nA (1 nano Ampere). The data provided in the graph of FIG. 4 may be converted into numerical values as shown in Table 1.

TABLE 1

| Time [Seconds] | Shift in Threshold Voltage (V) (First Embodiment) | Shift in Threshold Voltage (V) (Comparative Example) |
| --- | --- | --- |
| 0 | 0 | 0 |
| 10 | 0.25 | 0 |
| 30 | 0.5 | 0 |
| 100 | 0.25 | −0.5 |
| 300 | −0.5 | −1.25 |
| 1000 | −1.5 | −2.5 |
| 3600 | −2.75 | −4.25 |

Referring to FIG. 4 and Table 1, when stress was applied for 30 seconds, the conventional TFT display panel showed a smaller shift in the threshold voltage Vth than the TFT display panel of the first embodiment. However, as the stress time was increased, the TFT display panel of the first embodiment showed a far smaller shift in the threshold voltage Vth than the conventional TFT display panel. Specifically, when stress was applied for one hour (3600 seconds), the TFT display panel of the first embodiment showed a minor shift of −2.75 V in its threshold voltage Vth while the conventional TFT display panel showed a greater shift of −4.25 V in its threshold voltage Vth.

It can be understood from the above results that the TFT display panel of the first embodiment, which includes the passivation layer 70 made of SiNx, has improved current and voltage stability compared to the conventional TFT display panel.

Hereinafter, a method of fabricating a TFT display panel according to a second embodiment of the present invention will be described in detail with reference to FIGS. 1A, 1B and 5 through 13. FIGS. 5 through 13 are cross-sectional views depicting processes of fabricating the TFT display panel according to the second embodiment of the present invention. For simplicity, description of elements substantially identical to those of the first embodiment described above will not be repeated.

Figure 5:
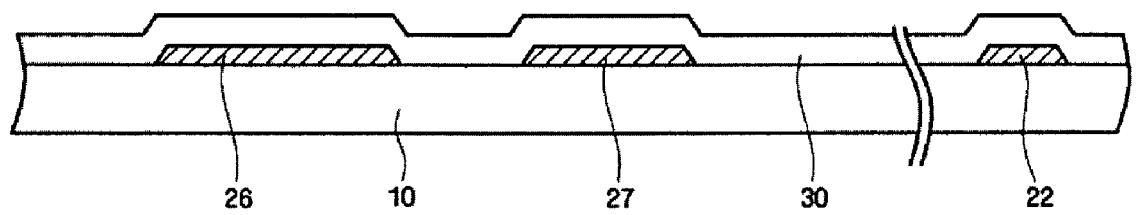
FIGS. 5 through 13 are cross-sectional views depicting processes for fabricating a TFT display panel according to another embodiment of the present invention.

Referring to FIGS. 1A and 5, metal layers (not shown) for forming gate wirings are stacked on an insulating substrate 10 and patterned to form gate wiring. Gate wirings include gate lines 22, gate electrodes 26, storage electrodes 27, and storage lines 28.

Here, sputtering may be performed to form the gate wirings. Sputtering may be performed at a low temperature of 200° C. or below. When the gate wirings are formed by sputtering at a low temperature, the deterioration of the insulating substrate 10 made of glass, e.g., soda lime glass, can be prevented. The above conductive (e.g., metal) layers are patterned by a wet-etching process or a dry-etching process. In the wet-etching process, an etchant, such as phosphoric acid, nitric acid or acetic acid, may be used.

Next, a gate insulating film 30 is formed on the insulating substrate 10 and the gate wirings (i.e., the gate line 22, the gate electrode 26, the storage electrode 27 and the storage line 28). The gate insulating film 30 is made of, e.g., SiNx and is deposited by plasma enhanced chemical vapor deposition (PECVD) or reactive sputtering. If the substrate 10 is made of a material with low thermo-tolerance, the gate insulating film 30 may be formed at a low temperature of 130° C. or below.

Figure 6:
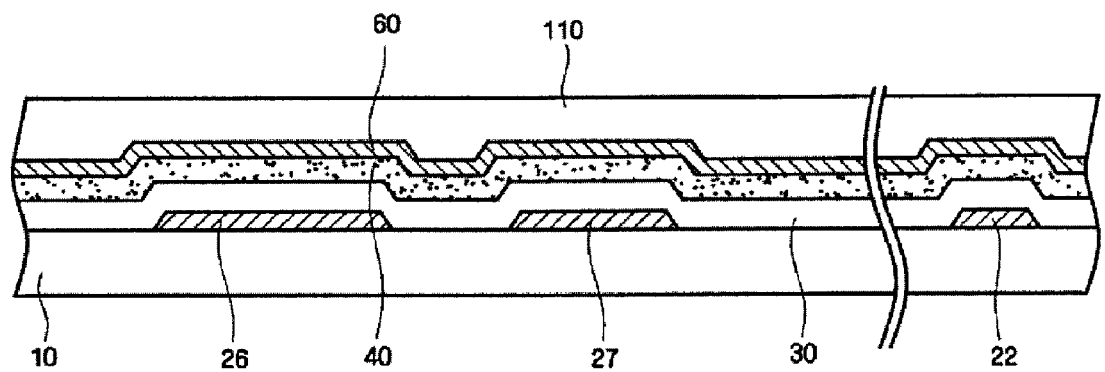

Referring to FIG. 6, an oxide active layer 40 and a conductive layer 60 for forming data wirings are sequentially deposited on the gate insulating film 30 by, e.g., sputtering. The oxide active layer 40 and the conductive layer 60 are sequentially deposited in a vacuum chamber. Here, the vacuum chamber remains at vacuum in order to prevent the properties of the oxide active layer 40 from deteriorating due to oxygen in the atmosphere. The term "active" denotes that the oxide active layer 40 is made of an active material which has electrical properties when driving current is applied to the active material. The active material includes a semiconductor and a metal oxide. Next, a photoresist layer 110 is coated on the conductive layer 60.

Figure 7:
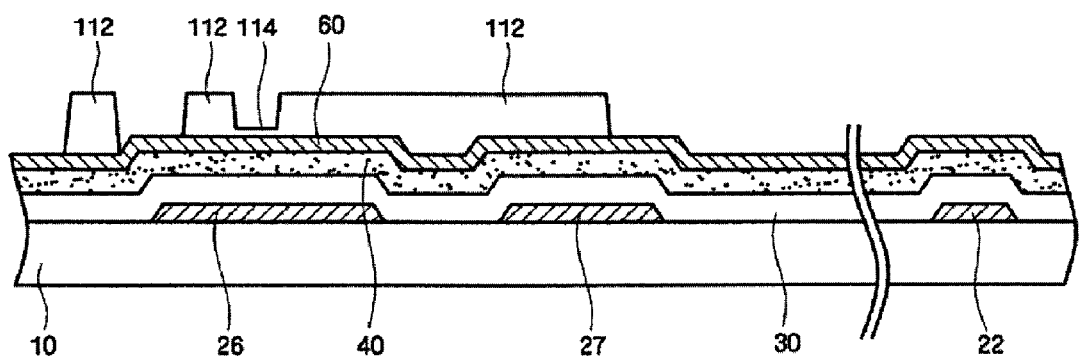

Referring to FIGS. 6 and 7, the photoresist layer 110 is exposed to light by using a mask and then developed to form photoresist layer patterns 112 and 114. The photoresist layer pattern 114 is disposed in a channel region of a TFT, that is, disposed between a source electrode 65 (see FIG. 10) and a drain electrode 66 (see FIG. 10). The photoresist layer pattern 112 is disposed in a data-wiring region, that is, a region where each of the data wiring is to be formed. The photoresist layer pattern 114 is thinner than the photoresist layer pattern 112. The entire photoresist layer 110 is removed, except for its portions remaining in the channel region and the data-wiring region. In this case, a ratio of a thickness of the photoresist layer pattern 114 remaining in the channel region to that of the photoresist layer pattern 112 remaining in the data-wiring region may vary according to processing conditions in etching processes which will be described later.

To vary the thickness of the photoresist layer 110 as described above, various methods may be used. For example, a mask having a slit, a lattice pattern, or a semi-transparent film may be used to control the amount of light that passes through the photoresist layer 110. The photoresist layer 110 may made of a material that can reflow. In this case, the photoresist layer 110 may be exposed to light by using a conventional mask that is divided into a transparent region through which light can completely pass and a semi-transparent region through which light cannot completely pass. Then, the photoresist layer 110 may be developed and reflowed, so that part of the photoresist layer 110 can flow to a region without the photoresist layer 110. As a result, the thin photoresist layer pattern 114 may be formed.

Figure 8:
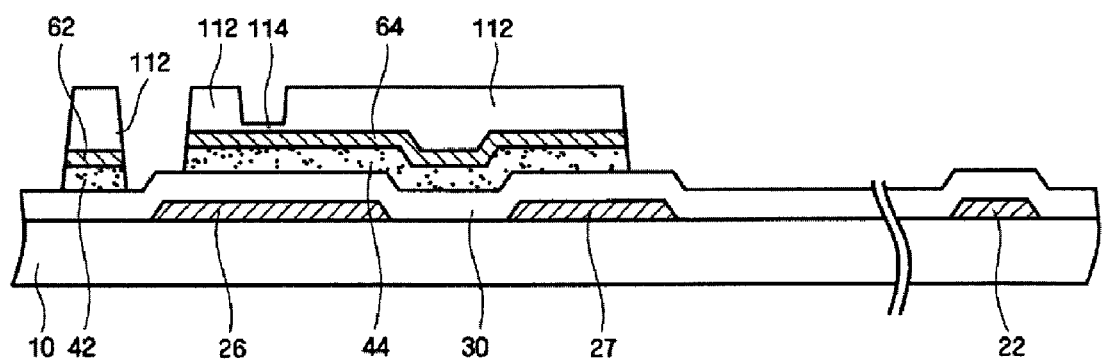

Referring to FIGS. 7 and 8, the conductive layer 60 is etched by using the photoresist layer patterns 112 and 114 as an etching mask. Here, the conductive layer 60 may be wet-etched or dry-etched. In the wet-etching process, a mixture of phosphoric acid, nitric acid and acetic acid or a mixture of hydrofluoric acid (HF) and deionized water may be used as an etchant. The entire conductive layer 60 is removed, except for its portions corresponding to a data line 62 and a conductive layer pattern 64 for forming the source and drain electrodes 65 and 66. After the conductive layer 60 is removed, the oxide active layer 40 disposed under the conductive layer 60 is exposed. The data line 62 and the conductive layer pattern 64 are shaped like data wirings (see FIG. 10), except that the conductive layer pattern 64 is not yet divided into the source electrode 65 (see FIG. 10) and the drain electrode 66 (see FIG. 10).

Next, the oxide active layer 40 is etched by using the photoresist layer patterns 112 and 114 as an etching mask to form oxide active layer patterns 42 and 44. In this case, the oxide active layer 40 may be etched while the gate insulating film 30 is not etched. In addition, the oxide active layer 40 may be wet-etched or dry-etched. In the wet-etching process, an etchant, which contains de-ionized water mixed with HF, sulfuric acid, hydrochloric acid or a combination of the same, may be used. In the dry-etching process, a fluorine (F)-based etching gas, such as $CHF_3$ or $CF_4$, may be used. Specifically, an F-based etching gas mixed with argon (Ar) or helium (He) may be used. Alternatively, both of the conductive layer 60 and the oxide active layer 40 may be patterned together by the wet-etching process.

Figure 9:
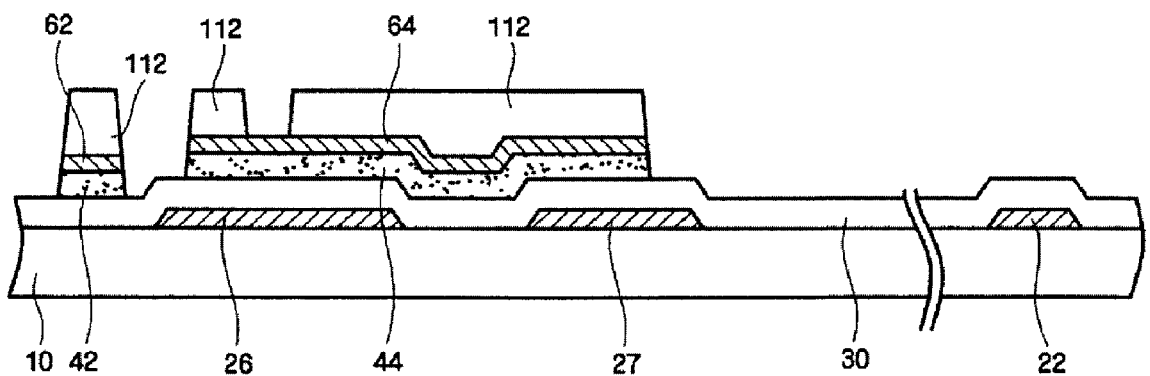

Referring to FIGS. 8 and 9, the photoresist layer patterns 112 and 114 are etched to remove the photoresist layer pattern 114 in the channel region. The thickness of photoresist layer pattern 112 may be reduced during this process. In addition, residues of the photoresist layer 110, which remain on a surface of the conductive layer pattern 64, are removed by an ashing process.

Figure 10:
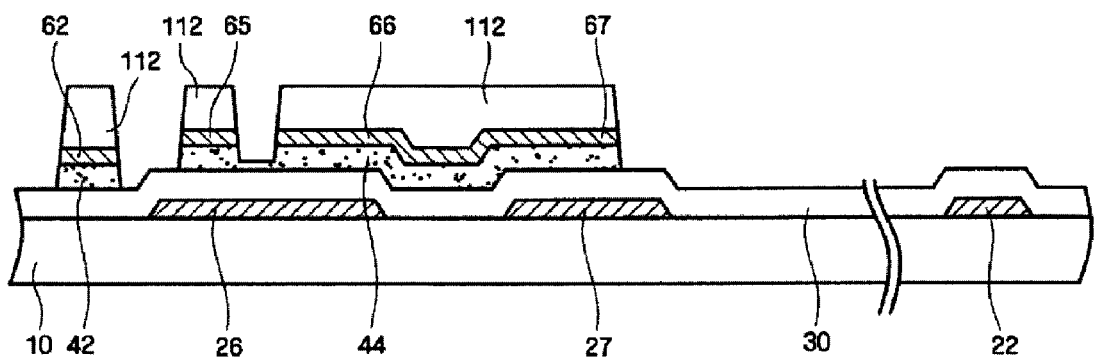

Referring to FIGS. 9 and 10, the conductive layer pattern 64 in the channel region is wet-etched or dry-etched by using the photoresist layer pattern 112 as an etching mask. In the wet-etching process, a mixture of phosphoric acid, nitric acid and acetic acid or a mixture of HF and deionized water may be used as an etchant. Part of the oxide active layer pattern 44 in the channel region may also be removed by a predetermined thickness.

As a result, the source electrode 65 is separated from the drain electrode 66 to complete each of the data wiring. The data wirings include the data line 62, the source electrode 65, the drain electrode 66, and a drain electrode extension portion 67. The data line 62 extends in the vertical direction and crosses the gate line 22 to define a pixel. The source electrode 65 branches off from the data line 62 and extends onto the oxide active layer pattern 44. The drain electrode 66 is separated from the source electrode 65 and formed on the oxide active layer pattern 44 to face the source electrode 65 with respect to the gate electrode 26 or the channel region of the TFT. The drain electrode extension portion 67 having a large area extends from the drain electrode 66 and overlaps the storage electrode 27.

Figure 11:
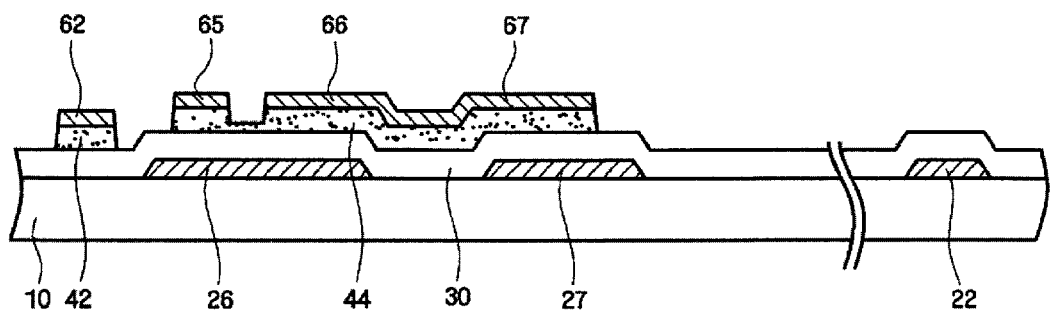

Referring to FIGS. 10 and 11, the photoresist layer pattern 112 remaining on each of the data wiring is removed.

Figure 12:
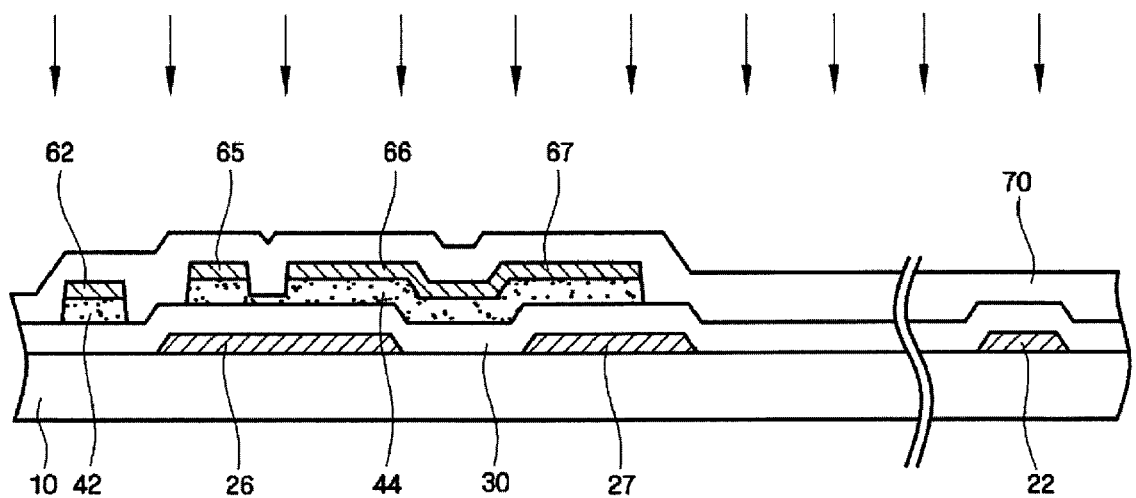

Referring to FIGS. 11 and 12, a passivation layer 70, which is made of SiNx, is formed on the oxide active layer patterns 42 and 44 and the data wirings. The passivation layer 70 may be deposited by, for example, reactive chemical vapor deposition (CVD). The passivation layer 70 may be made of SiNx that contains a minimum amount of hydrogen. It is desirable to form the passivation layer 70 by using SiNx that does not contain hydrogen.

The passivation layer 70 is formed by using a nitrogen ($N_2$) gas, a He or Ar gas, and a silane gas ($SiH_4$) as source gases. A ratio of the combined flow rates of the $N_2$ gas and He or Ar gas to a flow rate of the $SiH_4$ gas may be 28:1 to 2000:1. For example, when the sum of the flow rate of the N gas and the flow rate of the H gas is less than 28 times the flow rate of the $SiH_4$ gas, a silicon layer may be formed as the passivation layer 70. If the silicon layer forms the passivation layer 70, it will not have insulating properties. When the combined flow rates of the $N_2$ gas and the He/Ar gas is more than 2000 times the flow rate of the $SiH_4$ gas, a deposition rate is too low, which, in turn, makes it difficult to mass-produce the passivation layer 70.

The pressure within the deposition chamber into which source gases and the insulating substrate 10 are introduced may be in the range of 1500 to 5000 mTorr. When the passivation layer 70 is deposited under a pressure that is lower than the above range, it is formed as a silicon layer. In consideration of device reliability, the pressure within the deposition chamber may not exceed 5000 mTorr.

In addition, the passivation layer 70 may be formed under electrical conditions of 290 to 920 $W/m^2$. When the passivation layer 70 is deposited under an electrical condition of 290 $W/m^2$ or less, it may be formed as a silicon layer. As a result, the passivation layer 70 may not have insulating properties. In consideration of device reliability and energy efficiency, it is preferable if the power supplied to the deposition chamber is 920 $W/m^2$ or less.

Other processing conditions and materials for forming the passivation layer 70 are shown in Table 2.

TABLE 2

| Deposition Time (Seconds) | Power (W/m2) | Gap (mm) | Pressure (mTorr) | Nitrogen Flow Rate (sccm) | Helium Flow Rate (sccm) | Silane Flow Rate (sccm) | Temperature (° C.) | Deposition Rate (Å/sec) | Material of Passivation Layer |
|---|---|---|---|---|---|---|---|---|---|
| 400 | 172 | 1000 | 1500 | 500 | 900 | 50 | 245 | 7.41 | Si |
| 400 | 290 | 1000 | 1500 | 500 | 900 | 50 | 245 | 6.92 | SiNx |
| 400 | 460 | 1000 | 1500 | 500 | 900 | 50 | 245 | 7.91 | SiNx |
| 400 | 172 | 1000 | 1000 | 500 | 900 | 50 | 245 | 4.79 | Si |
| 400 | 172 | 1000 | 3000 | 500 | 900 | 50 | 245 | 4.58 | SiNx |
| 400 | 172 | 1000 | 1500 | 500 | 900 | 20 | 245 | 4.17 | SiNx |
| 400 | 172 | 1000 | 1500 | 500 | 900 | 100 | 245 | 5.94 | Si |
| 400 | 172 | 1000 | 1500 | 500 | 500 | 50 | 245 | 6.04 | Si |
| 400 | 172 | 1000 | 1500 | 500 | 750 | 50 | 245 |  | Si |

The gap means the spaced distance between a plasma generating device and the insulating substrate in the above table 2. Referring to Table 2, power per unit area which is applied to the deposition chamber, pressure applied into the deposition chamber, flow rates of source gases, and the like determine the material of the passivation layer 70. The material of the passivation layer 70 was identified by using an Ellipso meter technique. When the passivation layer 70 is formed of SiNx by adjusting the processing conditions, it hardly contains hydrogen atoms and thus may not deteriorate the properties of the oxide active layer patterns 42 and 44.

Figure 13:
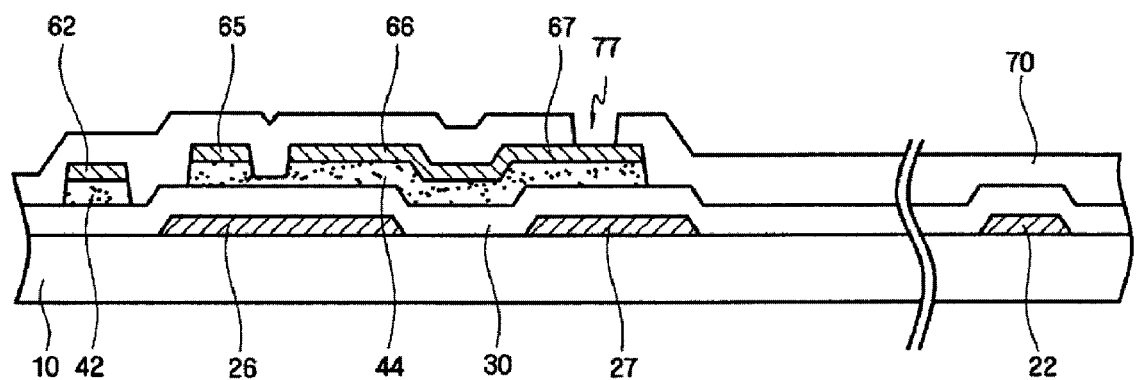

Referring to FIG. 13, a photolithography process is performed on the passivation layer 70 to form a contact hole 77 that extends to the drain electrode extension portion 67.

Finally, a transparent conductor or a reflective conductor such as ITO or IZO is deposited, and a photolithography process is performed on the transparent or reflective conductor to form a pixel electrode 82 which is connected to the drain electrode extension portion 67. As a result, the TFT display panel according to the second exemplary embodiment (see FIG. 1B) is completed.

Figure 14:
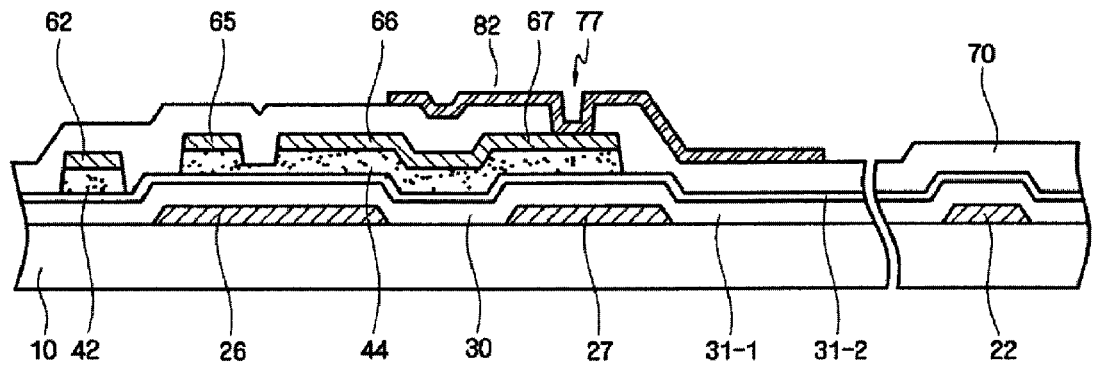
FIG. 14 is a cross-sectional view of a TFT display panel according to yet another embodiment of the present invention.

Hereinafter, a TFT display panel according to a third exemplary embodiment of the present invention will be described in detail with reference to FIG. 14. FIG. 14 is a cross-sectional view of the TFT display panel according to the third embodiment of the present invention.

A gate insulating film and a material of a passivation layer 70 included in the TFT display panel according to the third embodiment may be different from those included in the TFT display panel according to the first embodiment.

Referring to FIG. 14, the gate insulating film according to the third exemplary embodiment includes a lower gate insulating film 31-1 which is made of first SiNx and an upper gate insulating film 31-2 which is formed on the lower gate insulating film 31-1 and made of second SiNx.

Specifically, the lower gate insulating film 31-1 may be made of the first SiNx, and the first SiNx may contain hydrogen atoms. Since the lower gate insulating film 31-1 containing hydrogen atoms has a high deposition rate, it can be formed at low cost.

The upper gate insulating film 31-2 may include the second SiNx, and the second SiNx may contain a smaller amount of hydrogen than the first SiNx. Preferably, the second SiNx does not contain hydrogen. When the upper gate insulating film 31-2 does not contain hydrogen atoms, no hydrogen atom may move to the oxide active layer patterns so as to react with the oxide active layer patterns 42 and 44. Thus, the electrical properties of the lower gate insulating film 31-1 are maintained. The upper gate insulating film 31-2 can prevent hydrogen atoms of the lower gate insulating film 31-1 from moving to the oxide active layer patterns 42 and 44 and thus cause the oxide active layer patterns 42 and 44 to become conductive.

In consideration of processing time and cost, each of the upper and lower gate insulating films 31-2 and 31-1 may have a thickness of approximately 500 to 4000 Å.

The passivation layer 70 according to the third embodiment may be made of an inorganic matter such as SiOx, an organic matter having photosensitivity and superior planarization properties, or a low-k dielectric material formed by PECVD, such as a-Si:C:O or a-Si:O:F. The passivation layer 70 may have a double-layer structure composed of a lower inorganic layer and an upper organic layer.

The passivation layer 70 according to the third embodiment may be identical to the passivation layer 70 according to the first embodiment. That is, the passivation layer 70 according to the third embodiment may also be made of SiNx that does not contain hydrogen. In this case, upper surfaces of the oxide active layer patterns 42 and 44 may be protected by the passivation layer 70 which is made of SiNx, and lower surfaces of the oxide active layer patterns 42 and 44 may be protected by the upper gate insulating film 31-2 which is made of SiNx. Thus, the introduction of hydrogen into the oxide active layer patterns 42 and 44 can be prevented. Consequently, the electrical properties of the oxide active layer patterns 42 and 44 can be improved.

Figure 15:
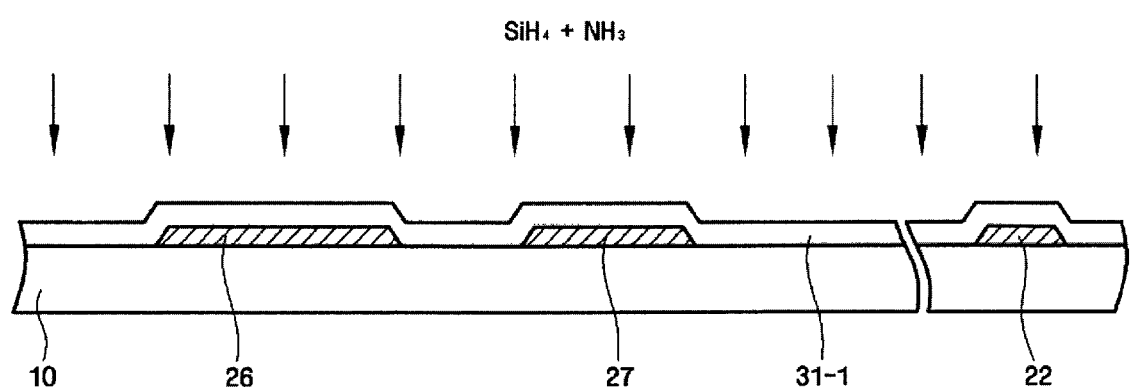
FIGS. 15 and 16 are cross-sectional views depicting processes for fabricating a TFT display panel according to yet another embodiment of the present invention.
Figure 16:
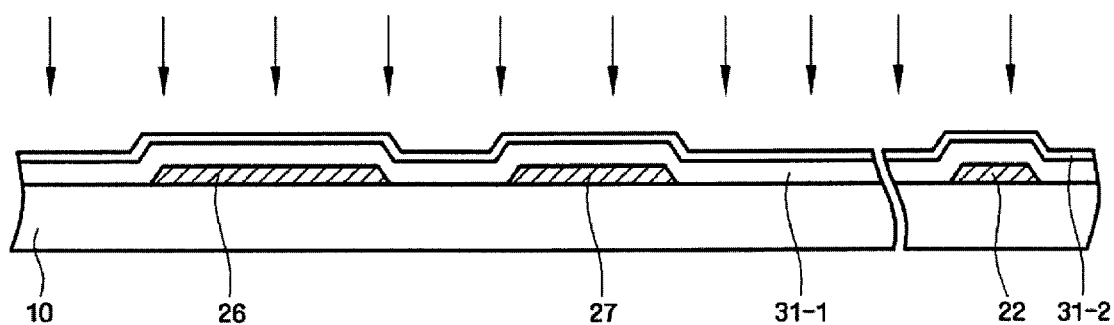

Hereinafter, a method of fabricating a TFT display panel according to a fourth embodiment of the present invention will be described in detail with reference to FIGS. 15 through 16. FIGS. 15 and 16 are cross-sectional views for explaining processes included in a method of fabricating the TFT display panel according to the fourth embodiment of the present invention.

Referring to FIG. 15, gate wirings are formed on an insulating substrate 10. Then, a lower gate insulating film 31-1 is formed on the insulating substrate 10 and the gate wirings. The lower gate insulating film 31-1 may be formed by using an ammonia (NH$_3$) gas or SiH$_4$ gas. The lower gate insulating film 31-1 may be made of first SiNx that contains a large amount of hydrogen.

Referring to FIG. 16, an upper gate insulating film 31-2 is formed on the lower gate insulating film 31-1. The upper gate insulating film 31-2 may be formed by using an N$_2$ gas, a He or Ar gas, and an SiH$_4$ gas as source gases. A ratio of the sum of the flow rate of the nitrogen gas and the flow rate of the He or Ar gas to the flow rate of the SiH$_4$ gas may be 28:1 to 2000:1. Thus, the upper gate insulating film 31-2 may be made of second SiNx that contains a smaller amount of hydrogen than the first SiNx. Processing conditions for forming the upper gate insulating film 31-2 may be substantially the same as the processing conditions for forming the passivation layer 70 according to the second embodiment.

The pressure within a deposition chamber into which source gases and the insulating substrate 10 are introduced may be in the range of 1500 to 5000 mTorr. When the upper gate insulating film 31-2 is deposited under a pressure that is lower than the above range, it is formed as a silicon layer. In consideration of device reliability, the pressure within the deposition chamber may not exceed 5000 mTorr.

In addition, the upper gate insulating film 31-2 may be formed under electrical conditions of 290 to 920 W/m². When the upper gate insulating film 31-2 is deposited under an electrical condition of 290 W/m² or less, it may be formed of silicon. As a result, the upper gate insulating film 31-2 may not have the insulating properties. In consideration of device reliability and energy efficiency, the power supplied to the deposition chamber may be 920 W/m² or less.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A thin-film transistor (TFT) display panel comprising:
    gate wirings formed on an insulating substrate;
    oxide active layer patterns formed on the gate wirings;
    data wirings formed on the oxide active layer patterns to cross the gate wirings, the data wirings contacting the oxide active layer patterns;
    a passivation layer formed on the oxide active layer patterns and the data wirings, wherein the passivation layer is made of silicon nitride (SiNx); and
    a pixel electrode which is formed on the passivation layer.

2. The display panel of claim 1, wherein
    the gate wirings include at least a gate wiring component, the gate wiring component including at least a first conductive layer and a second conductive layer, the first conductive layer having lower resistivity than the second conductive layer, the second conductive layer having superior contact characteristics with at least one of zinc oxide (ZnO), indium tin oxide (ITO), and indium zinc oxide (IZO) than the first conductive layer, and
    the passivation layer is made of SiNx which does not contain hydrogen.

3. The display panel of claim 1, wherein each of the oxide active layer patterns is made of any material selected from ZnO, InZnO, InGaO, InSnO, ZnSnO, GaSnO, GaZnO, GaZnSnO, and GaInZnO.

4. A TFT display panel comprising:
    gate wirings formed on an insulating substrate;
    a gate insulating film which comprises a lower gate insulating film formed on the gate wirings and made of first SiNx and an upper gate insulating film formed on the lower gate insulating film and made of second SiNx;
    oxide active layer patterns re formed on the gate insulating film;
    data wirings formed on the oxide active layer patterns to cross the gate wirings, the data wirings contacting the oxide active layer patterns;
    a passivation layer formed on the oxide active layer patterns and the data wirings; and
    a pixel electrode formed on the passivation layer,
    wherein the second SiNx contains a smaller amount of hydrogen than the first SiNx.

5. The display panel of claim 4, wherein
    the gate wirings include at least a gate wiring component, the gate wiring component including at least a first conductive layer and a second conductive layer, the first conductive layer having lower resistivity than the second conductive layer, the second conductive layer having superior contact characteristics with at least one of zinc oxide (ZnO), indium tin oxide (ITO), and indium zinc oxide (IZO) than the first conductive layer, and
    the second SiNx does not contain hydrogen.

6. The display panel of claim 4, wherein
    the second conductive layer is a lower layer of the gate wiring component,
    the first conductive layer is an upper layer of the gate wiring component, and
    the passivation layer is made of SiNx.

7. The display panel of claim 6, wherein the passivation layer is made of SiNx which does not contain hydrogen.

8. The display panel of claim 4, wherein each of the oxide active layer patterns is made of any material selected from ZnO, InZnO, InGaO, InSnO, ZnSnO, GaSnO, GaZnO, GaZnSnO, and GaInZnO.

9. A method of fabricating a TFT display panel, the method comprising:
    forming gate wirings on an insulating substrate;
    forming oxide active layer patterns on the gate wirings;
    forming data wirings on the oxide active layer patterns to cross the gate wirings, the data wirings contacting the oxide active layer patterns;
    forming a passivation layer of SiNx on the oxide active layer patterns and the data wirings; and
    forming a pixel electrode on the passivation layer.

10. The method of claim 9, wherein the passivation layer is formed by using a nitrogen ($N_2$) gas, a helium (He) or argon (Ar) gas, and a silane ($SiH_4$) gas as source gases, and a ratio of the combined flow rates of the $N_2$ gas and the He or Ar gas to a flow rate of the $SiH_4$ gas is about 28:1 to 2000:1.

11. The method of claim 10, wherein the passivation layer is formed under pressure conditions of 1500 to 5000 mTorr.

12. The method of claim 10, wherein the passivation layer is formed under electrical conditions of 290 to 920 W/m².

13. The method of claim 10 further comprising:
    forming at least a gate wiring component in the gate wirings;
    forming at least a first conductive layer of the gate wiring component and a second conductive layer of the gate wiring component, the first conductive layer of the gate wiring component having lower resistivity than the second conductive layer of the gate wiring component, the second conductive layer of the gate wiring component having superior contact characteristics with at least one of zinc oxide (ZnO), indium tin oxide (ITO), and indium zinc oxide (IZO) than the first conductive layer of the gate wiring component,
    wherein the passivation layer is made of SiNx which does not contain hydrogen.

14. A method of fabricating a TFT display panel, the method comprising:
    forming gate wirings on an insulating substrate;
    forming a lower gate insulating film, which is made of first SiNx, on the gate wirings and forming an upper gate insulating film, which is made of second SiNx, on the lower gate insulating film;
    forming oxide active layer patterns on the gate insulating film;

forming data wirings on the oxide active layer patterns to cross the gate wirings, the data wirings contacting the oxide active layer patterns;

forming a passivation layer on the oxide active layer patterns and the data wirings; and forming a pixel electrode on the passivation layer, wherein the second SiNx contains a smaller amount of hydrogen than the first SiNx.

15. The method of claim 14, wherein the upper gate insulating film is formed by using an $N_2$ gas, an He or Ar gas, and an $SiH_4$ gas as source gases, and a ratio of the combined flow rates of the $N_2$ gas and the He or Ar gas to a flow rate of the $SiH_4$ gas is 28:1 to 2000:1.

16. The method of claim 15 further comprising:

forming at least a gate wiring component in the gate wirings;

forming at least a first conductive layer of the gate wiring component and a second conductive layer of the gate wiring component, the first conductive layer of the gate wiring component having lower resistivity than the second conductive layer of the gate wiring component, the second conductive layer of the gate wiring component having superior contact characteristics with at least one of zinc oxide (ZnO), indium tin oxide (ITO), and indium zinc oxide (IZO) than the first conductive layer of the gate wiring component, wherein the upper gate insulating film is formed under pressure conditions of 1500 to 5000 mTorr.

17. The method of claim 15, wherein the upper gate insulating film is formed under electrical conditions of 290 to 920 $W/m^2$.

18. The method of claim 15, wherein the lower gate insulating film is formed by using an ammonia gas and the $SiH_4$ gas.

19. The method of claim 14, wherein the second SiNx does not contain hydrogen.

20. The method of claim 14, wherein the passivation layer is made of SiNx.

21. The method of claim 20, wherein the passivation layer is made of SiNx which does not contain hydrogen.

* * * * *